(12) United States Patent
Meyer

(10) Patent No.: US 8,264,864 B2
(45) Date of Patent: Sep. 11, 2012

(54) MEMORY DEVICE WITH BAND GAP CONTROL

(75) Inventor: Rene Meyer, Mountain View, CA (US)

(73) Assignee: Unity Semiconductor Corporation, San Jose, CA (US)

(*) Notice: Subject to any disclaimer, the term of this patent is extended or adjusted under 35 U.S.C. 154(b) by 185 days.

(21) Appl. No.: 12/653,835

(22) Filed: Dec. 18, 2009

(65) Prior Publication Data

US 2010/0155722 A1    Jun. 24, 2010

Related U.S. Application Data

(60) Provisional application No. 61/203,154, filed on Dec. 19, 2008, provisional application No. 61/203,192, filed on Dec. 19, 2008, provisional application No. 61/203,163, filed on Dec. 19, 2008, provisional application No. 61/203,187, filed on Dec. 19, 2008.

(51) Int. Cl.
    *G11C 11/00*    (2006.01)
(52) U.S. Cl. ............ 365/148; 257/43; 257/E21.04
(58) Field of Classification Search ............ None
    See application file for complete search history.

(56) References Cited

U.S. PATENT DOCUMENTS

| | | | |
|---|---|---|---|
| 2003/0034591 A1* | 2/2003 | Vagarali et al. | 264/681 |
| 2003/0151042 A1* | 8/2003 | Hueschen | 257/12 |
| 2003/0155602 A1* | 8/2003 | Krieger et al. | 257/306 |
| 2003/0173612 A1* | 9/2003 | Krieger et al. | 257/304 |
| 2006/0050598 A1* | 3/2006 | Rinerson et al. | 365/232 |
| 2006/0131692 A1* | 6/2006 | Saitoh et al. | 257/565 |
| 2008/0001172 A1* | 1/2008 | Karg et al. | 257/194 |
| 2008/0087890 A1* | 4/2008 | Ahn et al. | 257/43 |

OTHER PUBLICATIONS

Kobayashi K.; Yamaguchi S.; Higuchi T.; Shin S.; Iguchi Y., "Electronic transport properties and electronic structure of TiO2-doped YSZ", Solid State Ionics, Nov. 1, 2000.

* cited by examiner

*Primary Examiner* — Fei Fei Yeung Lopez
(74) *Attorney, Agent, or Firm* — Stolowitz Ford Cowger LLP

(57) ABSTRACT

A memory device with band gap control is described. A memory cell can include a conductive oxide layer in contact with and electrically in series with an electronically insulating layer. A thickness of the electronically insulating layer is configured to increase from an initial thickness to a target thickness. The increased thickness of the electronically insulating layer can improve resistive memory effect, increase a magnitude of a read current during read operations, and lower barrier height with a concomitant reduction in band gap of the electronically insulating layer. The memory cell can include a memory element that comprises the conductive oxide layer and the electronically insulating layer and can optionally include a non-ohmic device (NOD). The memory cell can be positioned in a two-terminal cross-point array between a pair of conductive array lines across which voltages for data operations are applied. The memory cell and array can be fabricated BEOL.

12 Claims, 8 Drawing Sheets

# MEMORY DEVICE WITH BAND GAP CONTROL

FIELD OF THE INVENTION

The present invention relates generally to semiconductors and memory technology. More specifically, the present invention relates to a memory device with band gap control.

BACKGROUND

Data storage in high-density memory devices may be accomplished using a variety of techniques. Often, the technique used depends upon whether or not the stored data is volatile or non-volatile. In volatile memory devices, such as SRAM and DRAM, for example, stored data may not be retained when power is removed from the memory device. On the other hand, for non-volatile memory devices, such as MRAM and FLASH devices, stored data may be retained when power is removed from the memory device.

Non-volatile memory devices having a memory cell including an electrolytic tunnel barrier layer in contact with an oxygen reservoir provided solutions for data retention, where the memory effect may be achieved during a program state when an electric field is applied across the electrolytic tunnel barrier layer. The electric field at the tunnel barrier is typically high enough to promote tunneling, and additionally, the electric field may penetrate the conductive oxide layer by at least a Debye length. When the polarity of a bias (voltage) applied across the memory cell is sufficient to enable an electric field to effectuate the movement of ions, whether positively or negatively charged, ions from the oxygen reservoir may be transported to and from the electrolytic tunnel barrier layer. In turn, current flows through the memory element.

When this occurs, the resistive memory effect (RME) may be measured against the width (e.g., thickness) of the electrolytic tunnel barrier layer. In general, an electrolytic tunnel barrier layer fabricated to a thicker width is desirable in order to achieve a higher RME. It would also be desirable to be able to increase the thickness of the electrolytic tunnel barrier layer to a maximal value in order to maximize the RME. However, there are practical restrictions on tunnel barrier thickness. For example, of the tunnel barrier is too thick (e.g., approximately >50 Å), then the applied voltages necessary for tunneling may exceed the capability of circuitry (e.g., CMOS devices) employed in conventional integrated circuit memory devices to supply the voltages for data operations (e.g., read and write operations).

Additionally, it has been observed that when the thickness of the electrolytic tunnel barrier layer increases, the current enabled to flow through the memory cell generally decreases. This occurs because the increased thickness of the electrolytic tunnel barrier layer presents a higher conduction barrier for ions to overcome when the memory cell is biased. When the memory cell is biased, achieving a higher current flow is beneficial so as to achieve a higher RME. Accordingly, it would be desirable to increase the thickness of the electrolytic tunnel barrier layer and increase the current capable of flowing through the memory cell so as to achieve a high RME while keeping the thickness of the electrolytic tunnel barrier layer within a range that does not exceed the voltage capabilities of drive circuitry that supply the voltages for data operations.

There are continuing efforts to improve design of non-volatile memory devices.

BRIEF DESCRIPTION OF THE DRAWINGS

Various examples are disclosed in the following detailed description and the accompanying drawings.

Figure 1:
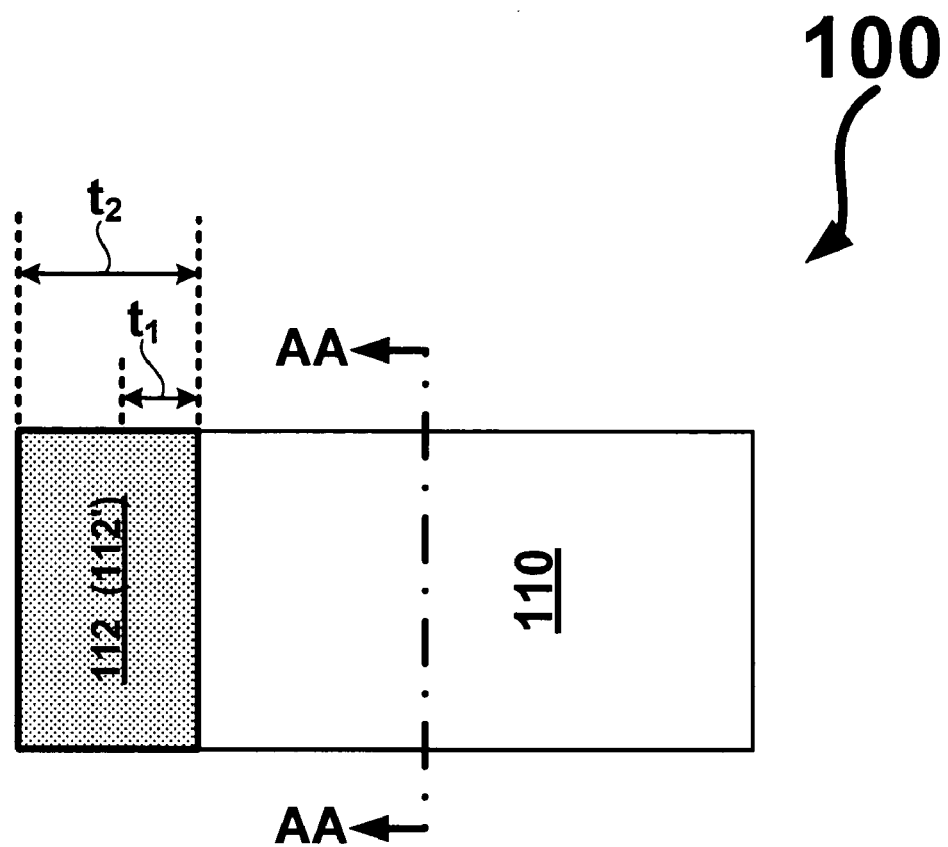
FIG. 1 depicts a cross-sectional view of an exemplary memory cell with band gap control.

Although the previous drawings depict various examples of the invention, the invention is not limited by the depicted examples. It is to be understood that, in the drawings, like reference numerals designate like structural elements. Also, it is understood that the depictions in the FIGS. are not necessarily to scale.

DETAILED DESCRIPTION

Various embodiments or examples may be implemented in numerous ways, including as a system, a process, an apparatus, or a series of program instructions on a computer readable medium such as a computer readable storage medium or a computer network where the program instructions are sent over optical, electronic, or wireless communication links. In general, operations of disclosed processes may be performed in an arbitrary order, unless otherwise provided in the claims.

A detailed description of one or more examples is provided below along with accompanying figures. The detailed description is provided in connection with such examples, but is not limited to any particular example. The scope is limited only by the claims, and numerous alternatives, modifications, and equivalents are encompassed. Numerous specific details are set forth in the following description in order to provide a thorough understanding. These details are provided as examples and the described techniques may be practiced according to the claims without some or all of the accompanying details. For clarity, technical material that is known in the technical fields related to the examples has not been described in detail to avoid unnecessarily obscuring the description.

In some examples, techniques such as those described herein enable emulation of multiple memory types for implementation on a single component such as a wafer, substrate, or die. U.S. patent application Ser. No. 11/095,026, filed Mar. 30, 2005, now U.S. Published Application No. 2006/0171200 A1, and entitled "Memory Using Mixed Valence Conductive Oxides," is hereby incorporated by reference in its entirety and for all purposes and describes non-volatile third dimensional memory elements that may be arranged in a two-terminal, cross-point memory array. The memory elements can be a component of a memory cell that can include electrically in series with the memory element, other structures including but not limited to a non-ohmic device (NOD) and electrodes. New memory structures are possible with the capability of this third dimensional memory array. The technology allows for the emulation of other memory technologies by duplicating the interface signals and protocols, while accessing the third dimensional memory array. The third dimensional memory array may emulate other types of memory, providing memory combinations within a single component.

FIG. 1 depicts a cross-sectional view of an exemplary memory cell with band gap control 100. Here, memory cell 100 includes conductive oxide layer 110, and electronically insulating layer 112 in contact with and electrically in series with the conductive oxide layer 110. Surfaces of each layer 110-112 may be substantially planar surfaces or share substantially similar surface undulations in some examples; however in other examples, these surfaces may be configured for stacked configuration memory array structures. It may be appreciated that memory cell 100 may be fabricated to be disposed between electrodes (not shown), or may be fabricated with additional thin film layers to form other memory devices, such as those referenced in U.S. patent application Ser. No. 11/095,026, already incorporated herein.

Conductive oxide layer 110 may be an electronic conductor, and may be configured to enable mobile ions (not shown) to move between electronically insulating layer 112 and conductive oxide layer 110 in response to an electric field in the memory cell 100 and having a predetermined magnitude and direction. Depending on a direction of the electric field that is generated by a voltage for data operations applied across the layers 110 and 112, mobile ions can move from the layer 110 and into the layer 112 or from the layer 112 and into the layer 110. Movement of the mobile ions from the layer 110 and into the layer 112 causes a conductivity profile (e.g., a resistive state) of the memory cell 100 to change to a first conductivity profile (e.g., a programmed high resistance state). On the other hand, movement of the mobile ions from the layer 112 and back into the layer 110 changes the conductivity profile of the memory cell 100 to a second conductivity profile (e.g., an erased low resistance state). The memory cell 100 stores non-volatile data as a plurality of conductivity profiles that can be non-destructively determined by applying a read voltage across the memory cell 100. Write voltages applied across the memory cell 100 (e.g., across the layers 110 and 112 or electrodes electrically connected with those layers) generate the electric field that moves the mobile ions and causes the change in the conductivity profile of the memory cell 100. The conductivity profile is unchanged after the write voltage is no longer applied such that the stored data is retained in the absence of power.

Conductive oxide layer 110 may be a conductive metal oxide (CMO), for example, a conductive perovskite material that typically exhibits memory characteristics. In some examples, conductive perovskites may comprise a mixed valence oxide having substantially mixed crystalline or polycrystalline perovskite structure. In other examples, perovskite materials, such as CMO, may include two or more metals being selected from a group of transition metals, alkaline earth metals and rare earth metals. Examples of conductive perovskite materials may include, but are not limited to: manganites (e.g., $PrCaMnO_x$—PCMO; $LaCaMnO_x$—LCMO; $LaSrMnO_x$—LSMO; $PrMnO_x$—PMO; and $LaSrCaMnO_x$—LSCMO); titanates (e.g., strontium titanate STO and a reduced STO); zirconates (SZO:Cr, CNO:Cr, TaO:Cr); $SrRuO_x$—SRO; $LaSrCrO_x$—LSCrO; $LaNiO_x$—LNO; $LaSrCrO_x$—LSCrO; $LaSrFeO_x$—LSFeO; $LaSrCoO_x$—LSCoO; and high Tc superconductors (e.g., YBCO).

Electronically insulating layer 112 may comprise an electrolytic tunnel barrier layer, and may be formed from an insulating material (e.g., a dielectric material) configured to allow ion movement. The term electrolyte refers to a medium that provides an ion transport, namely ion movement between positive and negative electrodes (not shown). As such, and by way of definition, electronically insulating layer 112 formed as an electrolytic tunnel barrier layer may be referenced as electrolytic tunnel barrier layer 112 and understood to mean that layer 112 may be an electronic insulator and an ionic conductor. In some examples, electrolytic tunnel barrier layer 112 can be an electrolyte to oxygen and can be enabled to facilitate movement of mobile oxygen ions in response to the aforementioned electric field in the memory cell 100. In that the electrolytic tunnel barrier layer 112 can be made from an insulating material with a high dielectric constant, the magnitude of the electric field will be higher in the electrolytic tunnel barrier layer 112 than in the conductive oxide layer 110 because the layer 110 has a lower dielectric constant due to its higher conductivity.

Electrolytic tunnel barrier layer 112 may be configured to effectuate a band gap (referred to also as "initial band gap"), and may be embodied as a material with bulk properties of an electronic insulator that allows ionic movement but is thin enough to enable electron tunneling at voltages for data operations (e.g., read and write voltages) applied across the layers 112 and 110 as described above. Suitable materials for electrolytic tunnel barrier layer 112 include but are not limited to yttria-stabilized zirconia (e.g., YSZ), zirconia (e.g., $ZrO_x$, or $ZrO_2$), hafnium oxide (e.g., $HfO_x$ or $HfO_2$), gadolinium oxide (e.g., $GdO_x$), lanthanum aluminum oxide (e.g., LAO), yttrium oxide ($Y_2O_x$), and erbium oxide (e.g., $ErO_x$, or $Er_2O_3$), where x>0. Electrolytic tunnel barrier layer 112 may be operative to provide electron tunneling such that memory cell 100 or 100' in FIG. 4 has a non-linear current-voltage (I-V) curve. Such electron tunneling may enable a current $I_C$ (FIG. 4) to flow through memory cell 100 or 100'. Tunneling mechanisms for the electrolytic tunnel barrier layer 112 may include but are not limited to single step tunneling processes (e.g., direct tunneling, Fowler-Nordheim tunneling, and thermionic field emission tunneling) or multi-step tunneling processes (e.g., trap-assisted tunneling).

Conductive oxide layer 110 may be formed to a thickness that is application specific. For example and generally, an approximate range of thickness for conductive oxide layer 110 may be in a range from about 100 Å to about 350 Å. The layer 110 can be comprises of a plurality of CMO layers that are in contact with one another where the total thickness of the layer 110 is the combined thickness of the plurality of CMO layers. The plurality of CMO layers can be made from different CMO materials. Where conductive oxide layer 110 comprises a conductive metal oxide (CMO), the thickness of layer 110 may be in the range of approximately 235 Å to 270 Å. Conductive oxide layer 110 and electronically insulating layer 112 may be formed using microelectronics fabrication techniques that are well understood in the semiconductor art for forming thin films. By way of example, fabrication techniques may include but are not limited to atomic layer deposition (ALD), chemical vapor deposition (CVD), sputtering, molecular beam epitaxy (MBE), spin-on deposition, pulsed laser deposition, electron-beam (e-beam) deposition, or thermal evaporation.

Figure 2:
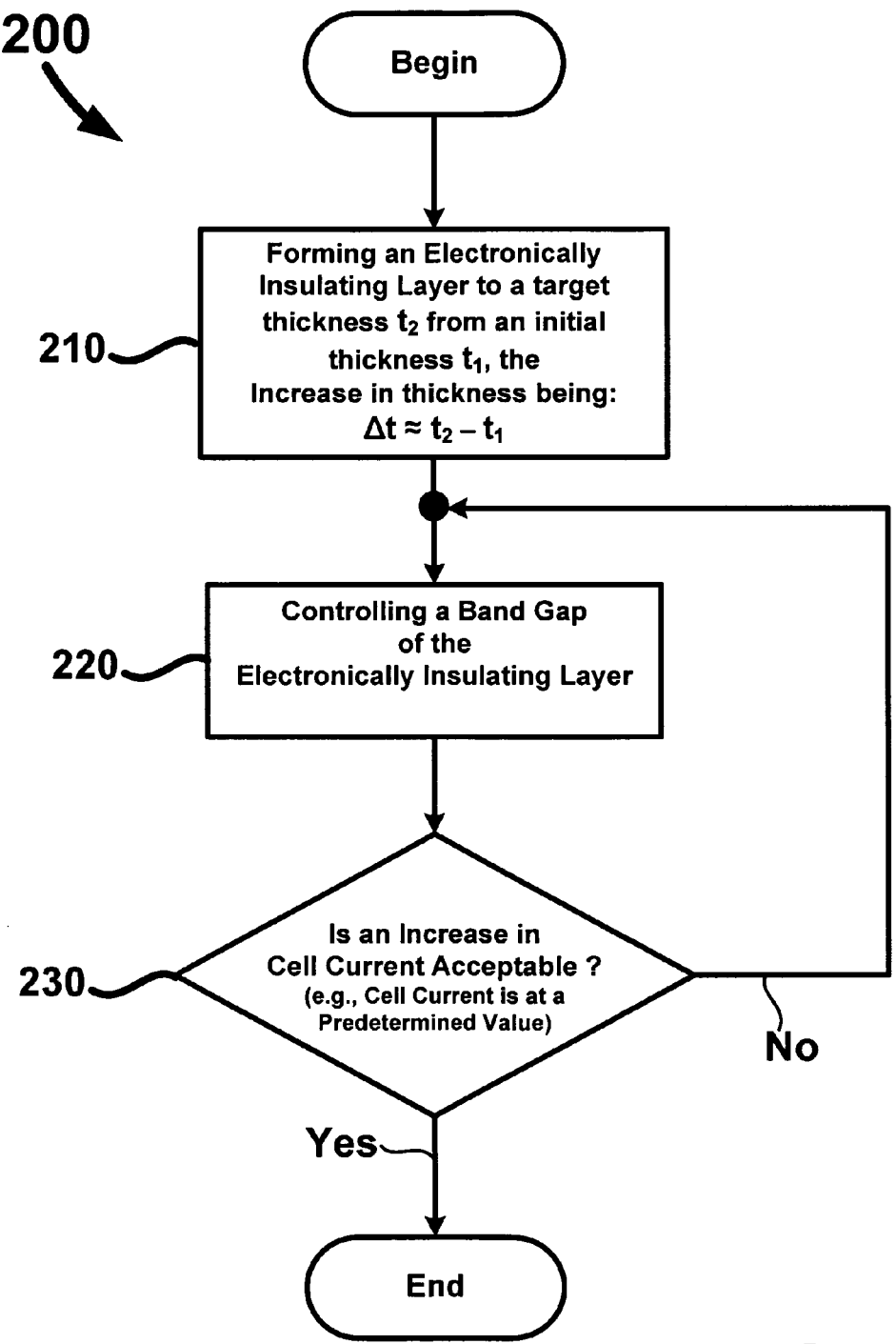
FIG. 2 depicts an exemplary process of forming an exemplary memory cell with band gap control.

Referring to FIG. 2, an exemplary process 200 of forming an exemplary memory cell with band gap control is shown. In describing process 200, reference may be made to FIG. 4, which depicts an exemplary conduction band diagram of an exemplary memory cell taken along line A-A of FIG. 1. Here in FIG. 2, a stage 210 represents forming an electronically insulating layer configured to include a target thickness $t_2$. Target thickness $t_2$ may represent an increase in thickness of electronically insulating layer 112, that is, an increase from an initial thickness $t_1$ to thickness $t_2$. The difference $\Delta t$ (e.g., $\Delta t = t_2 - t_1$) between target thickness $t_2$ and initial thickness $t_1$ can represent an increase of electronically insulating layer 112 to achieve a higher resistive memory effect (RME hereinafter) than is the case when the layer 112 has the initial thickness $t_1$, where $t_2 > t_1$. A stage 220 represents controlling the band gap effectuated with electronically insulating layer 112 so as to cause an increase in current (at a stage 230) capable of flowing through memory cell 100. Some benefits of achieving an increased current, that is, a current having a predetermined value selected based upon application, includes realizing a higher RME.

Figure 3:
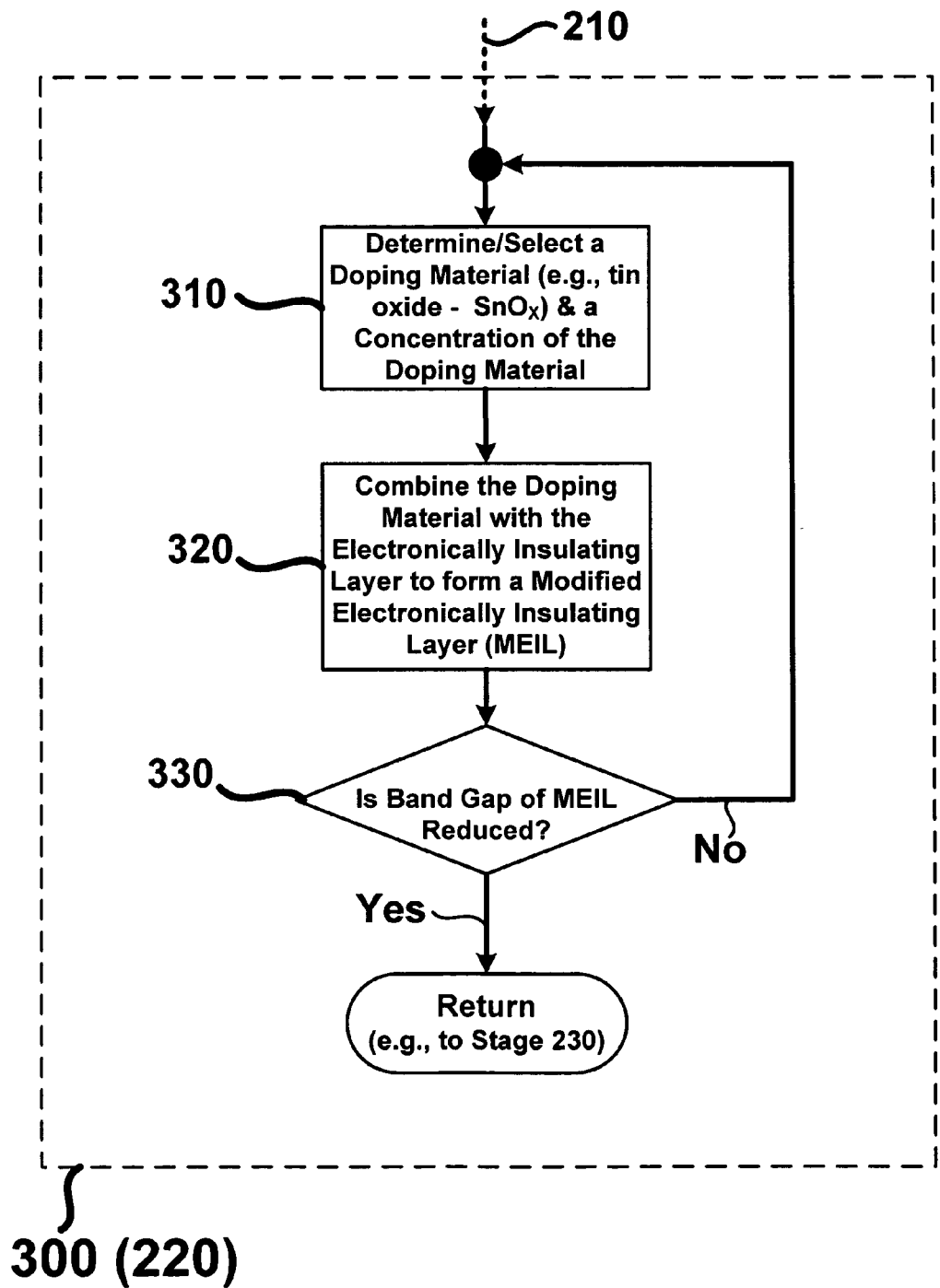
FIG. 3 depicts another exemplary process of forming an exemplary memory cell with band gap control.

FIG. 3 depicts another exemplary process 300 of forming an exemplary memory cell with band gap control. Here, process 300 corresponds to stage 220 of FIG. 2, and includes stages 310-330. A stage 310 represents determining and selecting a material (e.g., a dopant) to be used to form a modified electronically insulating layer (MEIL) denoted as 112' in FIGS. 1 and 4. A stage 320 represents combining the electronically insulating layer 112 with the material to form modified layer 112' that may effectuate a reduced band gap. In some examples where electronically insulating layer 112 may be formed from an electrolytic tunnel barrier layer comprising yttria-stabilized zirconia (YSZ), reference may be made to electrolytic tunnel barrier layer 112. Accordingly in such examples, modified layer 112' may be formed from a combination of the material with electrolytic tunnel barrier layer 112. At a stage 330, modified layer 112' may be further combined with a material (e.g., a dopant at the stages 310 and 320) until a predetermined and desired band gap reduction is achieved.

Figure 4:
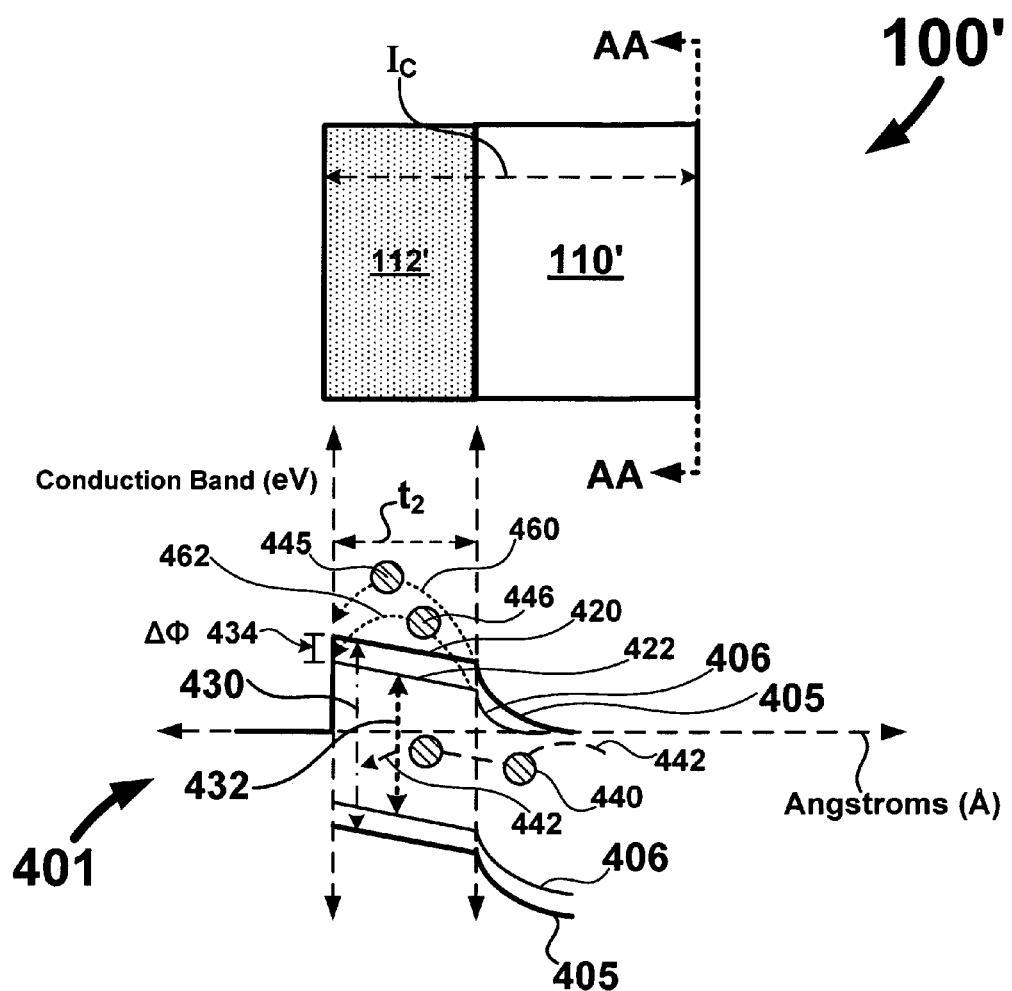
FIG. 4 depicts an exemplary conductive band diagram of an exemplary memory cell taken along line AA-AA of FIG. 1.

Turning to FIG. 4, and by way of examples, modified electronically insulating layer 112' may be configured to effectuate a reduction of band gap 430 (corresponding to electrolytic tunnel barrier 112) to band gap 432 (corresponding to modified layer 112'). In some examples where the material comprises tin oxide ($SnO_X$), and where a concentration of tin oxide ($SnO_X$) may be determined and selected, the combination of the tin oxide ($SnO_X$) at a selected concentration (e.g., at the stage 310 of FIG. 3) with the electrolytic tunnel barrier layer 112 (e.g., comprising YSZ) may form modified layer 112' having a substantially mixed crystalline structure. In other examples, a concentration of tin oxide ($SnO_X$) or some other dopant material (e.g., titanium oxide—$TiO_X$) can be selected to dope the electrolytic tunnel barrier layer 112, the combination of which can form modified layer 112'. For example, titanium oxide ($TiO_X$) can be used as the dopant for a hafnium oxide ($HfO_X$) electrolytic tunnel barrier layer 112. Referring back to FIG. 3, stages 310-330 may be repeated until an application-specific reduction in band gap is achieved and/or the increase in current through the memory cell 100 is achieved as depicted in stage 230 of FIG. 2. A process such as co-sputtering may be used to dope the electrolytic tunnel barrier layer 112, for example. A target material for the electrolytic tunnel barrier layer 112 and another target material for the selected dopant can be co-sputtered during deposition of the electrolytic tunnel barrier layer 112 to form the modified electrolytic tunnel barrier layer 112 (MEIL in FIG. 3). Other processes such as reactive sputtering, CVD, ALD, and the like may be used to deposit and/or effectuate the doping of the electrolytic tunnel barrier layer 112 to form the modified electrolytic tunnel barrier layer 112 (MEIL) with the desired reduction in band gap and/or increase in current (e.g., the stage 230 in FIG. 2) through the memory cell 100.

FIG. 4 depicts an exemplary conduction band diagram 401 of an exemplary memory cell 100' taken along line AA-AA of FIG. 1. Here in FIG. 4, conduction band diagram 401 may be represented as a graph with thickness corresponding to memory cell 100' taken along the x-axis (in Angstroms—Å) and with a conduction band value taken along orthogonal y-axis—in electron volts—eV). Conduction band diagram 401 is depicted for widths (i.e., thickness of layers) corresponding to modified electrolytic tunnel barrier layer 112', and conductive oxide layer 110'. Electrolytic tunnel barrier layer 112 (in FIG. 1) having thickness $t_1$ may be represented by conduction band 405 depicted in heavy line and having a band gap 430. Modified layer 112' having thickness $t_2$ may be configured to effectuate a substantially reduced (e.g., substantially lower, substantially smaller, substantially narrower) conduction band 406 having a reduced band gap 432. A difference between band gap 432 and band gap 430 may be represented by a difference ($\Delta\phi$) in barrier height 434. FIG. 4 illustrates that conduction band 405 may include a barrier height 420, while conduction band 406 associated with reduced band gap 432 may include a barrier height 422.

There may be a variety of transport mechanisms occurring at the ionic level of memory cell 100'. In some examples, controlling the band gap (stage 220 in FIG. 2) comprises reducing barrier height 420 to barrier height 422 to enable an increase of electrolytic tunneling 442 of oxygen ions 440 capable of migrating from conductive oxide layer 110' to modified layer 112'. Further, in other examples, controlling the band gap (at the stage 220) may be achieved by reducing barrier height 420 to barrier height 422 to enable an increase of electrolytic thermionic emission. During electrolytic thermionic emission, oxygen ions may be transported from conductive oxide layer 110' to modified layer 112'. In some examples where electrolytic tunnel barrier layer 112 is formed to a thickness $t_1$ (see FIG. 1), electrolytic thermionic emission 460 may occur when oxygen ions 445 are transported over barrier height 420. In other examples where modified electrolytic tunnel barrier layer 112' may be formed to a target thickness $t_2$, electrolytic thermionic emission 462 may occur when oxygen ions 446 are transported over barrier height 422. When an electric field is effectuated across memory cell 100' and penetrates conductive oxide layer 110', in response to an applied bias (e.g., write voltages applied across 100 or 100'—not shown), the resulting electric field can enable movement of oxygen ions 446 which encounter a lower barrier height 422 from conductive oxide layer 110' to modified layer 112'. More ions may be transported due to the lower barrier height 422, which in turn causes a higher current being enabled to flow through memory cell 100'. Increasing the thickness of electronically insulating layer (e.g., from an initial thickness $t_1$ to a target thickness $t_2$), and increasing the current $I_C$ capable of flowing through memory cell with band gap control 100', each can contribute to increasing the RME.

As examples of a target thickness $t_2$ of approximately 20 Å, the RME can be approximately 1. In other examples of a target thickness $t_2$ of approximately 24 Å, the RME can be approximately 10. In still other examples of a maximal target thickness $t_2$ of approximately 30 Å, the RME can be approximately 100. Above approximately 30 Å, the RME behavior becomes non-linear (i.e., the RME-to-thickness plot/graph/ curve reaches a peak and starts to decline in a generally parabolic shape). Accordingly, RME values within a substantially linear range of approximately 1 to 100 may be desirable, and to achieve this range of memory effect, the width of electronically insulating layer 112 may be increased from an initial thickness $t_1$ to target thickness $t_2$ within the range of approximately 20 Å to 30 Å. This increase in width, along with band gap control (at the stage 220) already described, are beneficial as a higher value for the current $I_C$ capable of flowing through the memory cell 100' may be achieved. It may be recognized that fabrication of modified electrolytic tunnel barrier layer 112' from a thickness $t_1$ to $t_2$ may be accomplished using microelectronics fabrication techniques previously discussed.

Figure 4A:
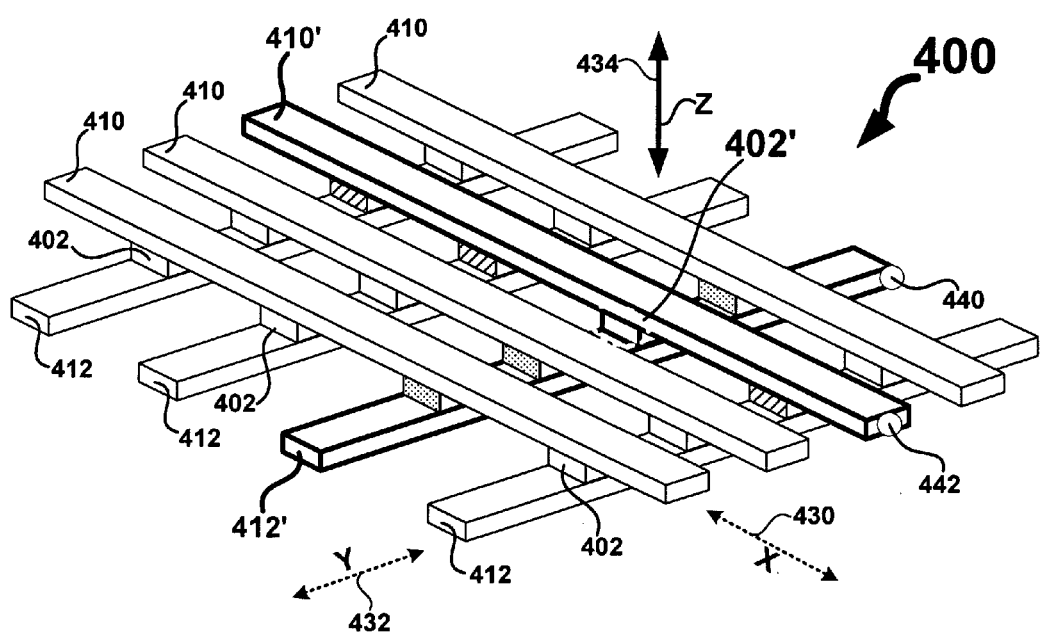
FIG. 4A depicts an exemplary perspective view of a cross-point array structure for a plurality of memory cells.

FIG. 4A depicts an exemplary perspective view of a cross-point array structure for a memory device where the above described memory cells (100, 100') are denoted as memory cells 402. Here, cross-point array 400 includes memory cells 402, first conductive array lines 410, second conductive array lines 412, x-axis 430, y-axis 432, z-axis 434, node 440 and node 442. In some examples, first conductive array lines 410 are configured substantially parallel to x-axis 430 and second conductive array lines 412 are configured substantially parallel to y-axis 432. In some examples, first conductive array lines 410 and second conductive array lines 412 are aligned substantially orthogonal to each other. In still other examples, the configuration and layout of first conductive array lines 410 and second conductive array lines 412 may be varied and are not limited to the descriptions provided. Memory cells 402 are formed between (e.g., at a cross-point) alternating layers of first conductive array lines 410 and second conductive array lines 412, such that each memory cell 402 is associated with and electrically coupled with only one first conductive array line 410 and only one second conductive array line 412.

Here, application of a voltage at node 440 provides a composite signal to first conductive array line 412' and application of a voltage at node 442 provides a composite signal to second conductive array line 410'. In some examples, the application of a composite signal to first conductive array line 412' and second conductive array line 412' selects memory cell 402' for a data operation (e.g., reading data from or writing data to memory cell 402'). In other examples, cross-point array 400 and the above-described elements may be varied in design and configuration and are not limited to the descriptions provided.

Figure 4B:
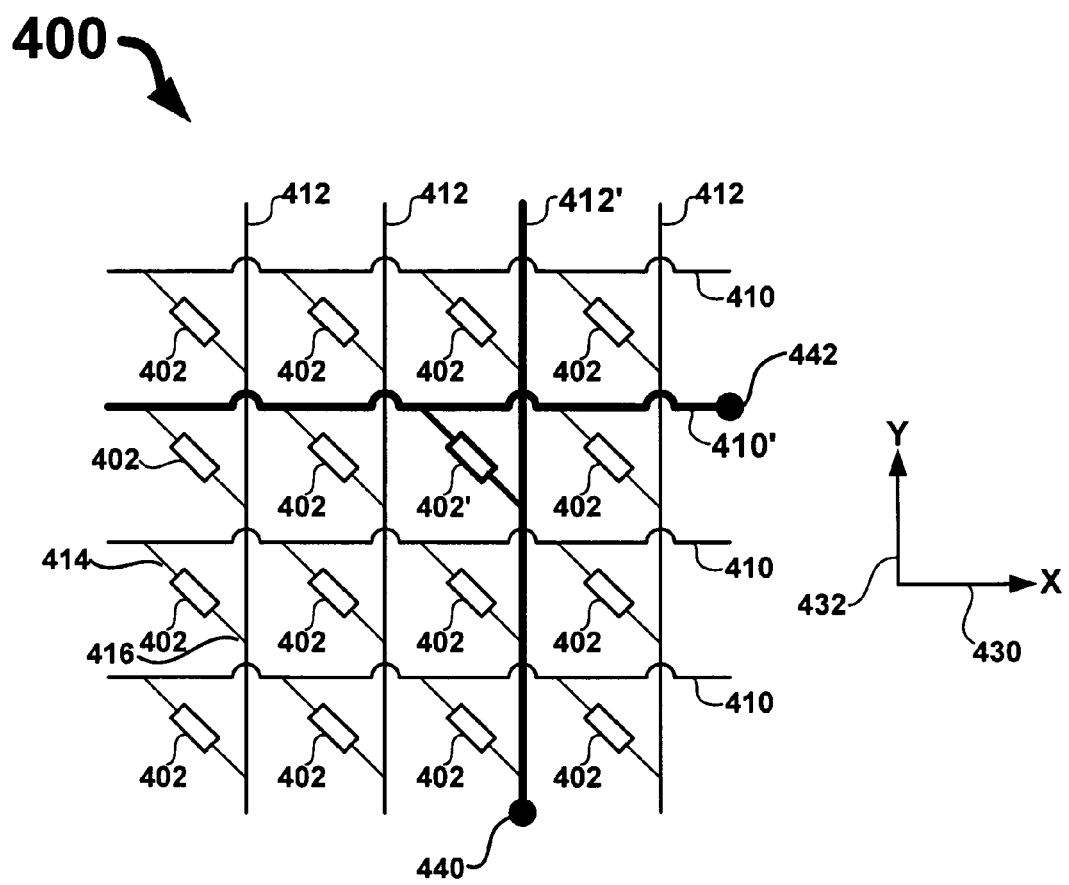
FIG. 4B depicts an exemplary schematic of a cross-point array structure for a plurality of memory cells.

FIG. 4B depicts an exemplary schematic of a cross-point array structure for a memory device. Here, cross-point array 400 includes memory cells 402, first conductive array lines 410, second conductive array lines 412, first terminal 414, second terminal 416, x-axis 430, y-axis 432, z-axis 434, node 440 and node 442. In some examples, first conductive array lines 410 are configured substantially parallel to x-axis 430 and second conductive array lines 412 are configured substantially parallel to y-axis 432. In some examples, first conductive array lines 410 and second conductive array lines 412 are aligned substantially orthogonal to each other. In still other examples, the configuration and layout of first conductive array lines 410 and second conductive array lines 412 may be varied and are not limited to the descriptions provided. Memory cells 402 are formed between alternating layers of first conductive array lines 410 and second conductive array lines 412, such that each memory cell 402 is associated with and electrically coupled with only one first conductive array line 410 and only one second conductive array line 412. Each memory cell 402 may include electrically in series with its terminals (414, 416) a two-terminal memory element and optionally a non-ohmic device (NOD) (see 476 in FIG. 4E). The NOD 476 is operative to block current from flowing through the memory cell 402 for voltages other than read or write voltages applied across its terminals (414, 416). NOD 476 can have a non-linear I-V characteristic operative alone or in conjunction with a non-linear I-V characteristic of the memory element 470, to substantially reduce or completely block current flow through memory cell 402 for applied voltages other than voltages for data operations. The NOD 476 can be implemented using a pair of diodes connected in a back-to-back configuration or using one or more layers of thin film dielectric materials that are in contact with one another and sandwiched between a pair of electrodes, sometimes referred to as a metal-insulator-metal (MIM) device, where the layer(s) of thin film dielectric material have thicknesses in a range of about 5 Å to about 50 Å, for example. Each memory element includes any thin film materials and/or structures operative to store data as a plurality of conductivity profiles that are reversible alterable by applying a write voltage across its terminals (414, 416) of its respective memory cell 402. For example, the layers (112, 112') and (110, 110') described above can comprise the memory element. If the optional NOD is included in the memory cell 402, then the NOD and the memory element are electrically in series with each other and the terminals (414, 416). Further, the read or write voltages applied the terminals (414, 416) of the memory cell 402 must be of sufficient magnitude to account for a voltage drop across the NOD such that the voltage drop across the terminals of the two-terminal memory element are of sufficient magnitude to read stored data from the memory element or write new data to the memory element.

Here, application of a voltage at node 440 provides a composite signal to first conductive array line 412' and application of a voltage at node 442 provides a composite signal to second conductive array line 410'. In some examples, the application of a composite signal to first conductive array line 412' and second conductive array line 412' selects memory cell 402' for a data operation. As an example, the remaining memory cells 402 of cross-point array 400 are unselected because their respective first terminal 414 and second terminal 416 are connected with first conductive array lines 410 and second conductive array lines 412 that are not providing a composite signal. In some applications, unselected conductive array lines (410, 412) may not be allowed to float and some nominal voltage (e.g., 50 mV) may be applied to those conductive array lines or they may be at a ground potential. In other examples, cross-point array 400 and the above-described memory cells may be varied in design and configuration and are not limited to the descriptions provided.

Figure 4C:
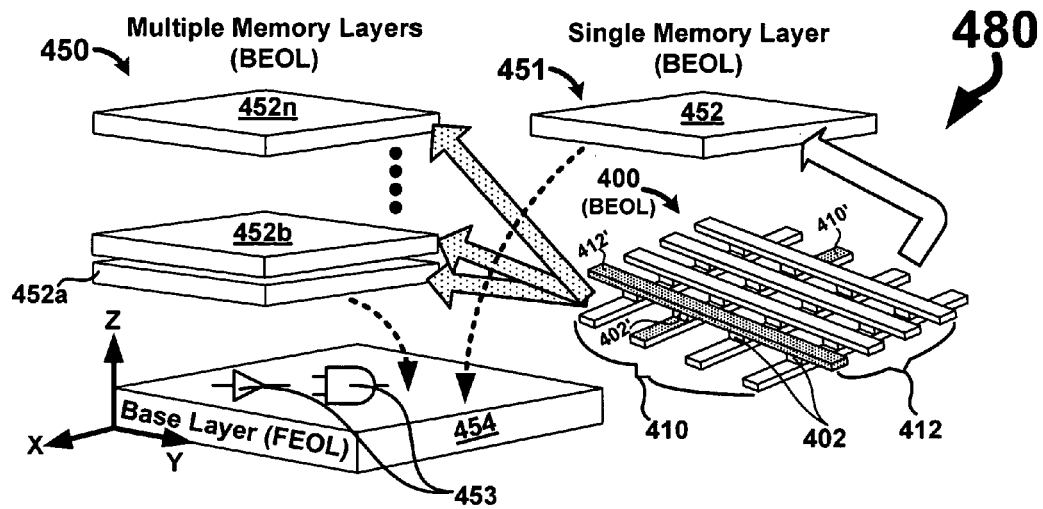
FIG. 4C depicts a single layer or multiple layers of memory arrays formed BEOL on top of a base layer including circuitry formed FEOL.

FIG. 4C depicts an integrated circuit including memory cells disposed in a single layer or in multiple layers of memory, according to various embodiments of the invention. In this example, integrated circuit 480 is shown to include either multiple layers 450 of memory (e.g., layers 452a, 452b, . . . 452n) or a single memory layer 451 (e.g., layer 452) formed on a base layer 454. In at least some embodiments, each layer (e.g., layer 452 or layers 452a, 452b, . . . 452n) of memory can be a cross point memory array 400 including conductive array lines 410 and 412 arranged in different directions to access re-writable memory cells 402 such as two-terminal memory cells as described above. Examples of conductive array lines include X-lines conductive array lines (e.g., 410) and Y-lines conductive array lines (e.g., 412). Base layer 454 can include a bulk semiconductor substrate (e.g., a silicon wafer) upon which memory access circuits 453 for performing data operations on the memory cells 402 in memory 450 or 451. Base layer 454 may include other circuitry that may or may not be related to data operations on memory. Base layer 454 and circuitry 453 (e.g., CMOS active circuitry such as decoders, drivers, sense amps, buffer, registers, etc.) can be formed in a front-end-of-the-line (FEOL) fabrication process and multiple memory layers 450 or single memory layer 451 can be formed in a back-end-of-the-line (BEOL) fabrication process tailored to fabricating layer(s) of memory arrays directly on top of the FEOL base layer 454. Although not depicted, the base layer 454 will include an inter-level interconnect structure configured to include nodes (e.g., openings in a dielectric material or electrically conductive structures such as vias, plugs, thrus, damascene structures, etc.) for facilitating electrical coupling between the circuitry 453 and the conductive array lines (410, 412) of the array(s)s so that signals (e.g., read and write voltages) for data operations (e.g., read and write operations) are electrically communicated between the array(s) and the circuitry 453.

Figure 4D:
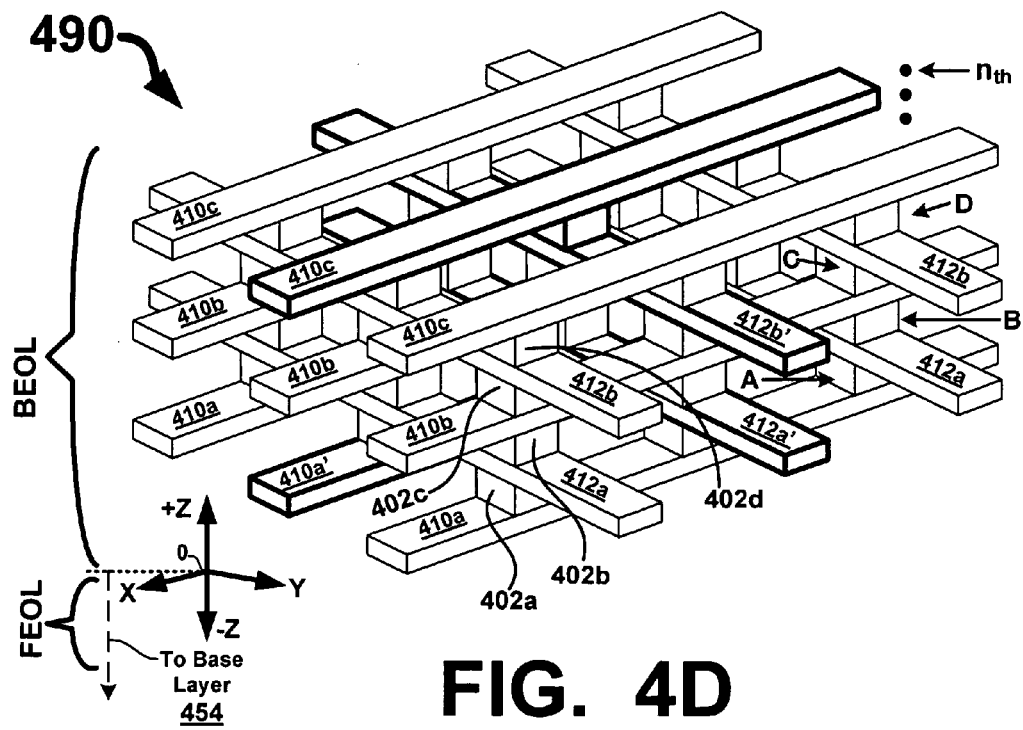
FIG. 4D depicts one example of a vertically stacked memory including multiple array layers that share conductive array lines and formed BEOL on top of a previously formed FEOL base layer.

Moving on to FIG. 4D, where a vertically stacked array 490 includes a plurality of memory layers A,B,C, and D with each memory layer including memory cells 402a, 402b, 402c, and 402d. Although only four layers are depicted, the array 490 can include additional layers up to an nth layer. The array 490 includes three levels of x-direction conductive array lines 410a, 410b, and 410c, and two levels of y-direction conductive array lines 412a, and 412b. Unlike the configuration for array 400 in FIG. 4A, the memory cells 402a, 402b, 402c, and 402d depicted in FIG. 4D share conductive array lines with other memory cells that are positioned above, below, or both above and below that memory cell. The conductive array lines, the memory cells, dielectric materials that electrically isolate structures in the array 490 (not shown), and other structures in the array 490 are formed BEOL directly above the FEOL base layer 454 (not shown) as indicated by +Z on the Z-axis above the dashed line at origin 0; whereas, the active circuitry for performing data operations on the array 490 and the interconnect structure for electrically coupling the active circuitry with the array 490 (e.g., the conductive array lines) are previously formed FEOL as indicated by –Z on the Z-axis below the dashed line at origin 0. Accordingly, the BEOL structure for array 490 is formed on top of the FEOL structure for base layer 154 with the order of fabrication going in a direction from –Z (i.e., FEOL) to +Z (i.e., BEOL) along the Z-axis.

Vertically stacked memory arrays can be configured as depicted in FIG. 4D where adjacent memory cells 402a, 402b, 402c, and 402d in array 490 share conductive array lines with memory cells positioned above and/or below (e.g., memory cells 402c and 402d share conductive array line 412b and memory cells 402a and 402b share conductive array line 412a, etc.). Alternatively, vertically stacked memory arrays can be configured as depicted in FIG. 4C where arrays and their respective conductive array lines in adjacent layers 452a, 452b, . . . 452n are electrically isolated from one another by a material such as a dielectric (e.g., silicon oxide—$SiO_2$ or silicon nitride—$SiN_x$).

Figure 4E:
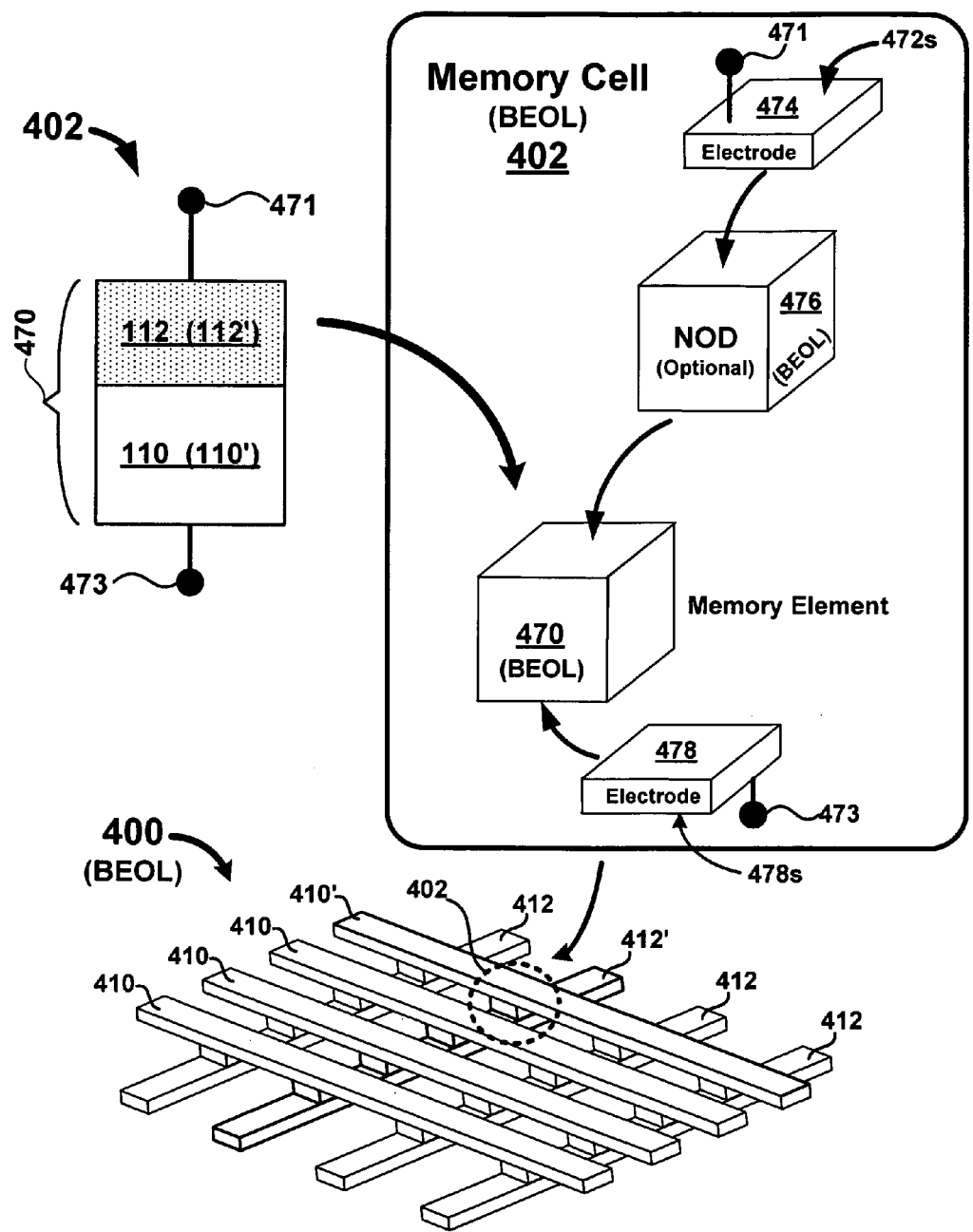
FIG. 4E depicts an example of memory cells positioned in a two-terminal cross-point array according to various embodiments of the invention.

FIG. 4E depicts an example of arrayed memory cells according to various embodiments of the invention. In this example, a memory cell 402 includes a memory element 470. The memory element 470 includes the above mentioned layers (110, 110', 112, 112'). Memory cell 402 further includes two the terminals 471 and 473. Terminals 471 and 473 can be electrically coupled with or can be formed as electrodes 474 and 478. The electrodes (474, 478) can be made from an electrically conductive material including, but not limited to, platinum (Pt), gold (Au), silver (Ag), iridium (Ir), iridium oxide ($IrO_x$), ruthenium (Ru), palladium (Pd), aluminum (Al), alloys of those materials, and the like. The electrodes (474, 478) can be in contact with and/or electrically coupled with conductive array lines operative to apply the aforementioned voltages for data operations, such as read voltages and write voltages (e.g., program and erase voltages) across one or more selected memory cells 402.

In at least some embodiments, memory cell 402 can include a non-ohmic device (NOD) 476, which, in turn, can be formed on the memory element 470 (e.g., positioned either above or below the memory element 470). NOD 476 can be a "metal-insulator-metal" (MIM) structure that includes one or more layers of electronically insulating material that are in contact with one another and sandwiched between metal layers (e.g., electrodes), or NOD 476 can be a pair of diodes electrically in series with each other and connected in a back-to-back configuration. U.S. patent application Ser. No. 11/881,473, filed Jul. 26, 2007, now U.S. Published Application No. 2009/0027976, and entitled "Threshold Device For A Memory Array", and U.S. patent application Ser. No. 12/283,339, filed Sep. 11, 2008, now U.S. Published Application No. 2009/0016094, and entitled "Selection Device for Re-Writable Memory" are both hereby incorporated by reference in their entirety and for all purposes and describe metal-insulator and diode based non-ohmic devices. Memory cell 402 can be formed between conductive array lines, such as array lines 412' and 410' Thus, memory cell 402 can be formed in an array of other memory cells 402. The array can be the cross-point array 400 including groups of conductive array lines 410 and 412. For example, array lines 410 can be electrically coupled with the electrodes 474 of the memory cells 402 and/or may be in contact with a surface 472s of the electrodes 474 and array lines 412 can be electrically coupled with the electrodes 478 of the memory cells 402 and/or may be in contact with a surface 478s of the electrodes 478.

In general, the devices and methods discussed herein are applicable to semiconductor memory (i.e., material used for data storage) formed and fabricated using various types of materials such as silicon dioxide, silicon oxide, noble metals, conductive metal oxides, and others. Examples of such memories include cross-point array memory and stacked cross point array memory (e.g., whether single layer non-volatile two-terminal cross-point arrays, or one or more vertically stacked non-volatile two terminal cross arrays), three/third-dimension memory arrays (including those that emulate other types of memory, providing memory combinations within a single component), resistive state memory devices, and memory systems.

The foregoing examples have been described in some detail for purposes of clarity of understanding, but are not limited to the details provided. There are many alternative ways and techniques for implementation. The disclosed examples are illustrative and not restrictive.

What is claimed is:

1. A non-volatile memory cell, comprising:
   at least one layer of a conductive oxide material that includes mobile ions; and
   an electronically insulating layer having a thickness that is approximately 50 Å or less, the electronically insulating layer is in contact with and is electrically in series with the at least one layer of the conductive oxide material, wherein a voltage for data operations applied across the electronically insulating layer and the at least one layer of the conductive oxide material is operative to generate a current, and
   wherein the electronically insulating layer is permanently doped with a dopant material that comprises tin oxide and is operative to increase a magnitude of the current while the voltage is applied, and the dopant material comprises a different material than a material of the mobile ions and the electronically insulating layer.

2. The non-volatile memory cell of claim 1, wherein the electronically insulating layer comprises an electrolytic tunnel barrier.

3. The non-volatile memory cell of claim 1, wherein the electronically insulating layer comprises a material selected from the group consisting of zirconia, yttria-stabilized zirconia, hafnium oxide, gadolinium oxide, lanthanum aluminum oxide, yttrium oxide, and erbium oxide.

4. The non-volatile memory cell of claim 1, wherein the at least one layer of the conductive oxide material comprises a perovskite.

5. The non-volatile memory cell of claim 4, wherein the perovskite comprises at least one material selected from the group consisting of PCMO, LCMO, LSMO, PMO, LSCMO, STO, a reduced STO, SRO, LSCrO, LNO, LSCrO, LSCoO, LSFeO, and YBCO.

6. The non-volatile memory cell of claim 1, wherein the thickness of the electronically insulating layer is in a range of approximately 20 Å to 30 Å.

7. The non-volatile memory cell of claim 1, wherein a total thickness for the at least one layer of the conductive oxide material is in a range from about 100 Å to about 350 Å.

8. The non-volatile memory cell of claim 1, wherein the mobile ions are oxygen ions.

9. The non-volatile memory cell of claim 1, wherein the electronically insulating layer is permeable to the mobile ions.

10. The non-volatile memory cell of claim 9, wherein the mobile ions are oxygen ions.

11. The non-volatile memory cell of claim 1, wherein the electronically insulating layer and the at least one layer of the conductive oxide material are operative to store data as a plurality of conductivity profiles that can be non-destructive determined by applying a read voltage across the electronically insulating layer and the at least one layer of the conductive oxide material, the plurality of conductivity profiles are retained in the absence of power so that the data is non-volatile, and wherein one of the plurality of conductivity profiles is a programmed conductivity profile generated by applying a programming voltage across the electronically insulating layer and the at least one layer of the conductive oxide material that is operative to transport at least a portion of the mobile ions from the at least one layer of the conductive oxide material and into the electronically insulating layer.

12. The non-volatile memory cell of claim 1, wherein the electronically insulating layer and the at least one layer of the conductive oxide material are operative to store data as a plurality of conductivity profiles that can be non-destructive determined by applying a read voltage across the electronically insulating layer and the at least one layer of the conductive oxide material, the plurality of conductivity profiles are retained in the absence of power so that the data is non-volatile, and wherein one of the plurality of conductivity profiles is an erased conductivity profile generated by applying an erase voltage across the electronically insulating layer and the at least one layer of the conductive oxide material that is operative to transport mobile ions from the electronically insulating layer and into the at least one layer of the conductive oxide material.

* * * * *